United States Patent [19]

Sakui et al.

[11] Patent Number: 4,777,625

[45] Date of Patent: Oct. 11, 1988

[54] DIVIDED-BIT LINE TYPE DYNAMIC SEMICONDUCTOR MEMORY WITH MAIN AND SUB-SENSE AMPLIFIERS

[75] Inventors: Koji Sakui, Tokyo; Shigeyoshi Watanabe, Yokohama, both of Japan

[73] Assignee: Kabushiki Kaisha Toshiba, Kawasaki, Japan

[21] Appl. No.: 89,518

[22] Filed: Aug. 26, 1987

[30] Foreign Application Priority Data

Sep. 3, 1986 [JP] Japan .................. 61-207194

[51] Int. Cl.[4] ............................................. G11C 11/40
[52] U.S. Cl. .................................... 365/189; 365/227; 365/230
[58] Field of Search ............... 365/189, 190, 205, 227, 365/182, 230

[56] References Cited

U.S. PATENT DOCUMENTS 4,421,996 12/1983 Chuang et al. ...................... 365/205
4,616,342 10/1986 Miyamoto ............................ 365/190
4,628,486 12/1986 Sakui .

FOREIGN PATENT DOCUMENTS 61-142594 6/1986 Japan .

OTHER PUBLICATIONS

IEEE International Solid-State Circuits Conference, "A 4Mb DRAM with Cross-point Trench Transistor Cell", Chattergee et al, Feb. 1986, pp. 268-269.

Primary Examiner—Terrell W. Fears
Attorney, Agent, or Firm—Oblon, Fisher, Spivak, McClelland, & Maier

[57] ABSTRACT

There is disclosed a divided-bit line type dynamic random access memory having parallel main bit line pairs which are formed on a substrate and to each of which sub-bit line pairs are provided in parallel with each other. Parallel word lines insulatively cross the sub-bit line pairs. Memory cells are provided at the crossing points of the sub-bit line pairs and the word lines. Each memory cell has a capacitor for storing information and a voltage-controlled switching transistor such as a MOSFET. First sense amplifier circuits are connected to the sub-bit line pairs, while second sense amplifier circuits are connected to the main bit line pairs. In a restoring mode, a specific sub-bit line pair, to which a selected memory cell is connected, is electrically disconnected from the corresponding main bit one pair, and a first sense amplifier circuit connected thereto is activated to perform a restoring operation. At this time, the remaining sub-bit line pairs other than the specific sub-bit line pair are also connected to the corresponding main bit line pair, and the first sense amplifier circuits of the remaining sub-bit line pairs are rendered inoperative to save power consumption.

7 Claims, 3 Drawing Sheets

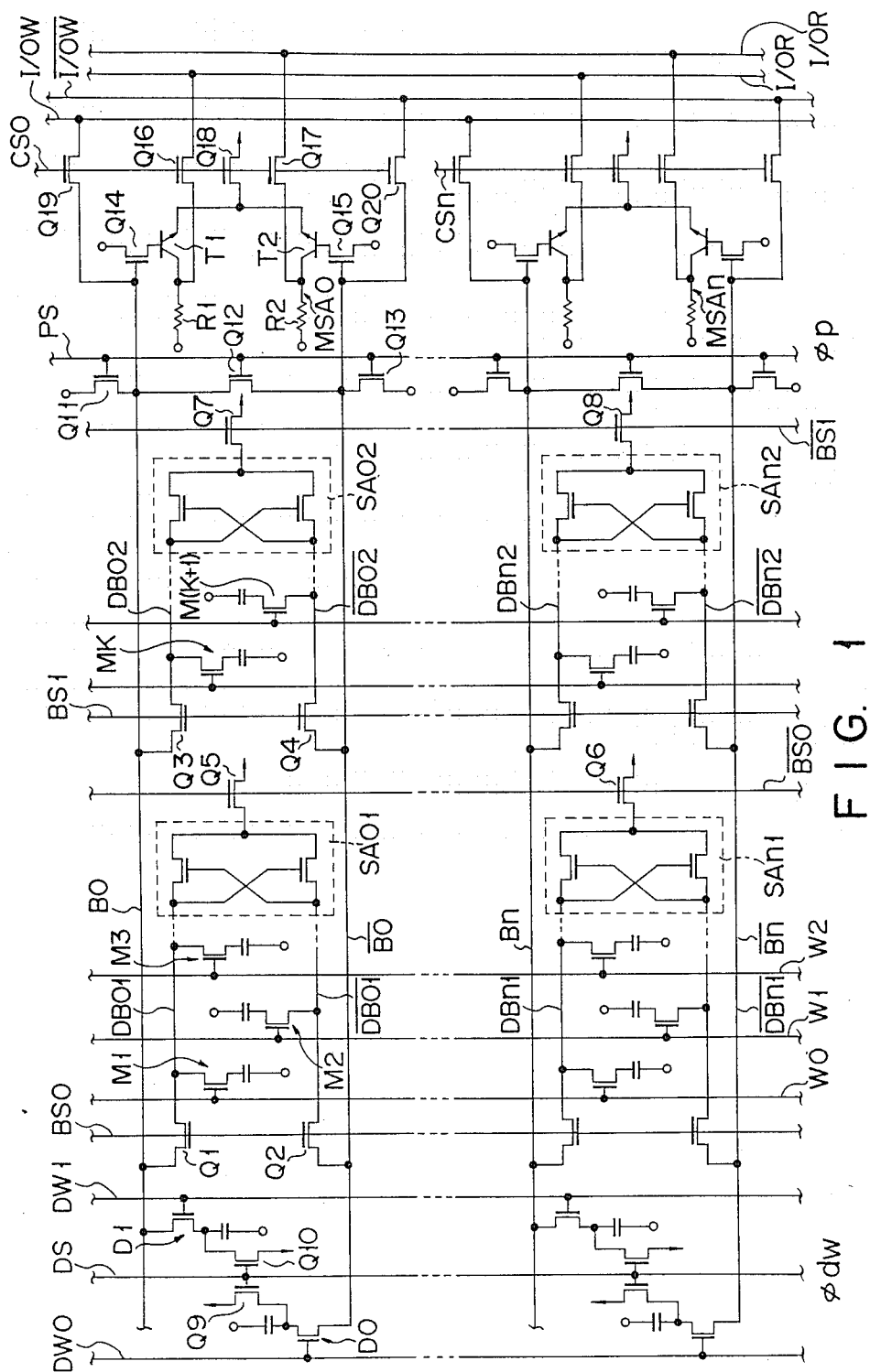
F I G. 1

FIG. 2A ϕp
FIG. 2B WO
FIG. 2C DWO
FIG. 2D BO
FIG. 2E $\overline{BO}$
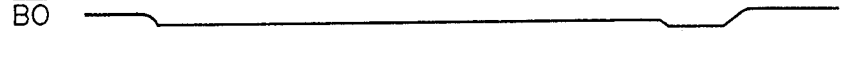
FIG. 2F CSO
FIG. 2G I/OR
FIG. 2H $\overline{I/OR}$
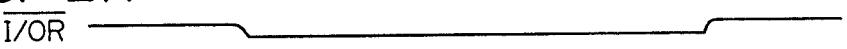
FIG. 2I BSO
FIG. 2J $\overline{BSO}$
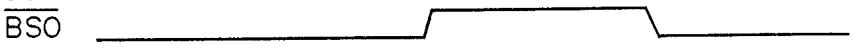
FIG. 2K DBO1
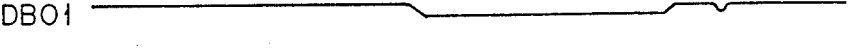
FIG. 2L $\overline{DBO1}$
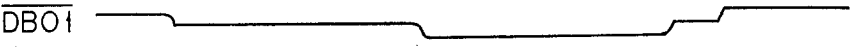
FIG. 2M ϕdw
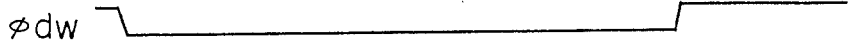

ID=4,777,625

DIVIDED-BIT LINE TYPE DYNAMIC SEMICONDUCTOR MEMORY WITH MAIN AND SUB-SENSE AMPLIFIERS

BACKGROUND OF THE INVENTION

The present invention relates to a semiconductor memory device, and more particularly, to a divided-bit line type dynamic random access memory having plural pairs of main bit lines, each of which is connected with plural pairs of sub-bit lines through the respective transfer gates.

Development of semiconductor memories continues in order to satisfy the ever-demanding high integration. To realize large-scale integrated dynamic random access memories (referred to as "dRAMs" hereinafter), the divided-bit line technique appears to be very promising. According to this technique, each of parallel bit line pairs formed on a substrate is connected to plural pairs of sub-bit lines via the respective transfer gates. When one memory cell is selected, the transfer gate of the sub-bit line pair to which the selected cell belongs, is opened and the read cell data voltage is supplied to a corresponding main bit line pair. A sense amplifier provided on the main bit line pair amplifies the read cell data voltage and then outputs it onto output lines. An example of the dRAM employing this technique is disclosed in "A 4Mb DRAM With Cross-point Trench Transistor Cell," Pallab K. Chatterjee et al., Digest of Technical Papers of 1986 IEEE International Solid-State Circuits Conference, pages 268 to 269.

However, dRAMs of this type have a difficulty in improving the data accessing speed and reducing the power consumption. It takes a sufficiently long period of time corresponding to the time required for the logical amplitude difference on the main bit line pair to become sufficiently large, from the point of time when one word line is designated for data readout from a desired cell to the point of time when the sense amplifier of the main bit line pair is made active. Since the sense amplifiers are of MOS dynamic type, the operation speed of the dRAM is reduced. According to the divided-bit line type dRAM, when the cell data is readout, sense amplifierse of the main bit line pairs, positioned along the selected word line, must be made active for the necessity of data restoring. As a result, the current flowing through the main bit lines is increased, which causes the dRAM to suffer from excessive power consumption.

SUMMARY OF THE INVENTION

It is therefore an object of the present invention to provide a new and improved dynamic semiconductor memory device, which has high memory integration density and low power consumption.

It is another object of the present invention to provide a new and improved dynamic semiconductor memory device, which has a high operation speed as well as high memory integration density and low power consumption.

In accordance with the above objects, the present invention is addressed to a specific dynamic semiconductor memory device, which has a divided-bit line structure. Parallel main bit line pairs are formed on a substrate and include a certain pair having first and second bit lines. Sub-bit line pairs are provided parallel to the certain main bit line pair. Parallel word lines are provided on the substrate to insulatively cross the sub-bit line pairs. Memory cells are provided at the crossing points of the sub-bit line pairs and word lines, with each memory cell having a capacitive element for storing information and a voltage-controlled transistor connected to the capacitive element.

The stored information appears as a potential difference on a specific sub-bit line pair to which the selected memory cell is connected.

First sense amplifier circuits of differential amplifier type are connected to the respective main bit line pairs, and sense and amplify the potential difference on the first and second bit lines of the main bit line pair to which the specific sub-bit line pair is connected.

In a pre-charge mode and a data readout mode, all of the sub-bit line pairs are electrically connected to the corresponding main bit line pair. In a restoring mode, the specific sub-bit line pair is electrically disconnected from the corresponding main bit line pair and a second sense amplifier circuit connected to the specific sub-bit line pair is activated, thereby performing the data restoring operation on the specific sub-bit line pair. During this operation, the remaining sub-bit line pairs provided on the main bit line pair having the specific sub-bit line pair are kept electrically connected to that main bit line pair. At this time, the second sense amplifier circuits connected to the remaining sub-bit line pairs are rendered inoperative.

The invention and its objects and advantages will become more apparent as the detailed description of a preferred embodiment presented below proceeds.

BRIEF DESCRIPTION OF THE DRAWINGS

In the detailed description of a preferred embodiment of the invention presented below, reference is made to the accompanying drawings in which:

FIG. 1 is a circuit diagram showing a divided-bit line type dynamic random-access memory according to one preferred embodiment of the present invention;

FIGS. 2A to 2M show waveforms of the electric signals which are generated at the major circuit components of the dynamic random-access memory shown in FIG. 1.

DETAILED DESCRIPTION OF THE PREFERRED EMBODIMENTS

Figure 3:
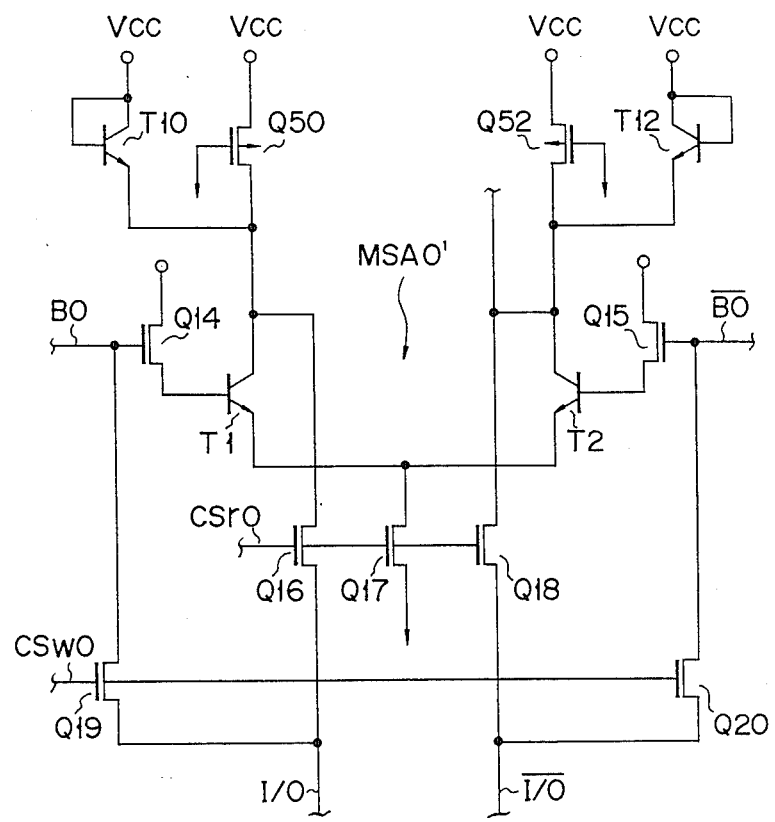
FIG. 3 is a circuit diagram showing a modified main sense-amplifier provided for a main-bit line pair of the dynamic random-access memory of FIG. 1.

FIG. 1 illustrates the circuit arrangement of the main portion of a divided-bit line type dynamic random access memory (referred to as a "dRAM" hereinafter) according to an embodiment of this invention. In FIG. 1, a chip substrate is omitted for the sake of diagrammatic simplicity; if the substrate were illustrated in FIG. 1, it would be shown as a rectangular block surrounding the overall circuit diagram of FIG. 1.

Plural pairs of main bit lines $Bi$ and $\overline{Bi}$ ($i=0, 1, 2, \ldots, n$) are provided parallel to one another on a semiconductor substrate (not shown). In FIG. 1, only a first main bit line pair B0 and $\overline{B0}$ and an n-th main bit line pair Bn and $\overline{Bn}$ are illustrated for diagrammatic simplicity. Plural pairs of divided-bit lines $DBj$ and $\overline{DBj}$ ($j=1, 2, \ldots, m$) are electrically connected in parallel to each main bit line pair $Bi$ and $\overline{Bi}$ respectively. These divided-bit lines will be called sub-bit lines or sub-bit line pairs in this specification.

A plurality of sub-bit line $\overline{DBj}$ and DBj are connected to a corresponding main bit line pair Bi and $\overline{Bi}$ through switching transistors (e.g., MOSFETs) that serve as transfer gates. For instance, the first sub-bit line pair DB01 and $\overline{DB01}$ are connected to the corresponding main bit line B0 and $\overline{B0}$ through MOSFETs Q1 and Q2 that serve as transfer gates. MOSFETs Q1 and Q2 are connected at their gate electrodes to a sub-bit line pair select line BS0. The second sub-bit line pair DB02 and $\overline{DB02}$ are connected to the corresponding main bit pair B0 and $\overline{B0}$ through MOSFETs Q3 and Q4. MOSFETs Q3 and Q4 are connected at their gate electrodes to a sub-bit line pair selection line BS1. When one selection line BSj is designated, the transfer gates connected to the designated select line BSj are opened so that a set of corresponding sub-bit line pairs DBi1,..., DBin are selected.

Sense amplifiers SAj (hereinafter referred to as "sub-sense amplifiers") are provided for sub-bit line pairs DBj, respectively. For instance, for first main bit line pair B0 and $\overline{B0}$, sub-sense amplifier SA01 is connected to sub-bit line pair DB01 and $\overline{DB01}$ and sub-sense amplifier SA02 is connected to sub-bit line pair DB02 and $\overline{DB02}$. As illustrated, each sub-sesnse amplifier SA is constituted by a flip-flop circuit using two MOSFETs. Sub-bit line pairs DBn1 and $\overline{DBn1}$ and DBn2 and $\overline{DBn2}$ connected to the n-th main bit line pair Bn and $\overline{Bn}$ are constituted similarly.

The first set of word lines W0, W1, W2,... extends on the substrate to be perpendicular to the first sub-bit line pair DB01 and $\overline{DB01}$, which are connected to the first main bit line pair B0 and $\overline{B0}$, and the first sub-bit line pair DBn1 and $\overline{DBn1}$ which are connected to the n-th main bit line pair Bn and $\overline{Bn}$. Memory cells M1, M2, M3,... are respectively provided at the crossing points of word lines W0, W1, W2,... and sub-bit lines DB01 and $\overline{DB01}$,..., DBn1 and $\overline{DBn1}$. Each memory cell M is constituted by a MOSFET and a MOS capacitor. Sub-bit line pair selection line BS0 intersects, at right angles, sub-bit line pairs DB01 and $\overline{DB01}$,..., DBn1 and $\overline{DBn1}$ and is connected to the gate electrodes the gate transistors Q1, Q2,... provided on these subbit line pairs. When sub-bit line select line BS0 is activated, gate transistors Q1, Q2,... are simultaneously rendered conductive, thus electrically connecting sub-bit line pairs DB01 and $\overline{Db01}$,..., DBn1 and $\overline{DBn1}$ to main bit line pairs.

The second set of word lines Wk, W(k+1),... runs on the substrate to be perpendicular to the second subbit line pair DB02 and $\overline{DB02}$, which are connected to the first main bit line pair B0 and $\overline{B0}$, the second subbit line pair DBn2 and $\overline{DBn2}$ which are connected to the n-th main bit line pair Bn and $\overline{Bn}$. Memory cells Mk, M(k+1),... are respectively provided at the crossing points of word lines Wk, W(k+1),... and sub-bit lines DB02 and $\overline{DB02}$,..., DBn2 and $\overline{DBn2}$. As illustrated, each memory cell M is constituted by a MOSFET and a MOS capacitor. Sub-bit line pair select line BS1 intersects, at right angles, sub-bit line pairs DB02 and $\overline{DB02}$, ..., DBn2 and $\overline{DBn2}$ and is connected to the gate electrodes of the gate transistors Q3, Q4,... provided on these subbit line pairs.

Activation control transistors constituted by MOSFETs are connected to the first set of sub-sense amplifiers SA01,..., SAn1. Since only two main bit line pairs are illustrated in FIG. 1 as mentioned earlier, the transistors connected to these main bit line pairs are denoted by reference numerals "Q5" and "Q6." MOSFETs Q5 and Q6 are connected at their gate electrodes to an activation control line BS0, which runs perpendicular to main bit line pair B. Similarly, the second set of sub-sense amplifiers SA02,..., SAn2 are connected to an activation control line BS1 through MOSFETs Q7 and Q8. When the potential of one activation control line $\overline{BS}$ (BS0, for example) becomes logic level "H," the MOSFETs connected to this line, e.g., Q5 and Q6, are rendered conductive so that the corresponding sub-sense amplifiers (e.g., SA01,..., SAn1) are simultaneously activated.

Dummy cell word lines DW0 and DW1 run perpendicular to the first to n-th main bit line pairs B0 and $\overline{B0}$, ..., Bn and $\overline{Bn}$ Dummy cells D0, D1,... are respectively provided at the crossing points of word lines DW0 and DW1 and main bit line pairs B0 and $\overline{B0}$, ... , Bn and Bn. Each dummy cell D is constituted by a MOSFET and a MOS capacitor, the capacitance of which is set half as small as the memory capacitor. Dummy cells D0 and D1 provided on each main bit line pair Bi are connected to a write control line DS through MOSFETs Q9 and Q10. The gate electrodes of MOSFETs Q9 and Q10 are connected together to write control line DS. When a write clock signal $\phi dw$ is supplied to write control line DS, MOSFETs Q9 and Q10 are rendered conductive, thus writing a source voltage Vss into dummy cells D0 and D1. The writing of source voltage Vss into the dummy cells D is performed simultaneously on all the main bit line pairs B.

Three pre-charge MOSFETs Q11, Q12 and Q13 are provided on the first main bit line pair B0 and $\overline{B0}$. The gate electrodes of these pre-charge MOSFETs Q11, Q12 and Q13 are connected to a pre-charge control line PS. Precharge MOSFETs provided on the n-th main bit line pair Bn and $\overline{Bn}$ are also connected at their gate electrodes to the pre-charge control line PS. In a pre-charge mode, when a pre-charge clock signal $\phi p$ with its voltage level increased by a drain voltage Vdd, is supplied, precharge MOSFETs Q11, Q12 and Q13 are rendered conductive. All the main bit line pairs Bi and $\overline{Bi}$ are charged to drain voltage Vcc through these pre-charge MOSFETs.

The first main bit line pair B0 and $\overline{B0}$ have a differential amplification type sense amplifier MSA1, which is hereinafter called main sense amplifier for the purpose of being distinguished from "sub-sense amplifiers" SA01, SA02,... of sub-bit line pairs DB01, DB02,... in this specification. Main sense amplifiers MSAi are respectively provided on main bit line pairs Bi and $\overline{Bi}$. The main sense amplifier provided on the n-th main bit line pair Bn and $\overline{Bn}$ is denoted by reference symbol "MSAn."

Main sense amplifier MSA0 is constituted by a source follower circuit, comprising MOSFETs Q14 and Q15, and a current mirror type differential amplifier circuit having bipolar transistors T1 and T2. The differential amplifier circuit therefore has a BICMOS structure. Main bit lines B0 and $\overline{B0}$ are respectively connected to the gate electrodes of MOSFETs Q14 and Q15 that serve as data readout control gates. Consequently, a change in the potential across main bit lines B0 and $\overline{B0}$ is given through the source follower circuit to main sense amplifier MSA0. As illustrated, npn type bipolar transistors T1 and T2 are connected together at their emitter electrodes. Load resistors R1 and R2 are connected to the collector electrodes of bipolar transistors T1 and T2. The collector potential of bipolar transistors T1 and T2, i.e., the output voltage of main sense amplifier MSA0, is supplied through MOSFETs Q16 and Q17 to a pair of inputoutput read lines IOR and IOR. The common emitter electrode of bipolar transistors T1 and T2 is connected to a MOSFET Q18. Main bit line pair B0 and B0 are connected to a pair of inputoutput write lines IOW and IOW, through MOSFETs Q19 and Q20, which serve as data write control gates. The gate electrodes of MOSFETs Q16 to Q20 are connected to the first column select line CS0. The main sense amplifier MSAn provided on the n-th main bit line pair Bn and Bn is also constituted in the above manner.

The operation modes of the divided-bit type dRAM having the above-described structure will now be explained referring to the signal waveform diagrams of FIGS. 2A to 2M. To facilitate easier understanding, in FIGS. 2A to 2M, each signal waveform is given with a symbol that represents the type of the signal waveform.

Source voltage potential Vss is written in advance in all the dummy cells, including dummy cells D0 and D1 provided on the first main bit line pair B0 and B0, through the write control MOSFETs (Q9 and Q10) which are rendered conductive in response to dummy cell write control clock signal $\phi dw$ (see FIG. 2M for its waveform) supplied from write control line DS.

In the pre-charge mode, when pre-charge clock signal $\phi p$ (see FIG. 2A) whose voltage level is increased to drain voltage Vdd is supplied through pre-charge control line PS, pre-charge transistors including MOSFETs Q11, Q12 and Q13 are rendered conductive. Consequently, all the main bit line pairs B0 and B0, . . . , Bn and Bn are simultaneously charged up to power source voltage Vcc. During this period, sub-bit line pair select lines BS0, BS1, . . . are kept at logic H as shown in FIGS. 2I and 2J, while sub-sense amplifier activation control lines BS0, BS1, . . . are kept at logic L. During the pre-charging, therefore, all the sub-bit line pairs DB are connected to main bit line pairs B and are charged up to the same potential as the main bit line pairs B, i.e., power source voltage Vcc.

In the data readout mode, when one word line, for example, word line W0 is selected, dummy word line DW0 is also selected at the same time. At this time, the potentials on word line W0 and dummy word line DW0 increase to logic H, as illustrated in FIGS. 2B and 2C. As a result, the cell transistors of memory cell M1 and dummy cell D0 are rendered conductive so that the memory cell data potential and the dummy cell potential are transferred to main bit line pair B0 and B0. When the data stored in memory cell M1 has a logic level of "1" (i.e., drain voltage Vdd), the potential on main bit line B0 does not vary (see FIG. 2D). When the data stored in memory cell M1 has a logic level of "0" (i.e., Vss), the potential on main bit line B0 decreases from drain voltage Vdd to the level that is defined as follows:

$$Vcc \cdot Cb(Cb + Cs)$$

where Cb is the total capacitance of one main bit line pair B and the sub-bit line pairs DB connected thereto, and Cs is the capacitance of the memory cell.

Since the capacitance Cd of dummy cell D0 is half the memory cell capacitance Cs, it is expressed as Cd=Cs2. Because, as mentioned earlier, source voltage Vss is written in advance in the dummy cell, the potential on main bit line-B0 descreases as shown in Fig. 2E. This potential drop is from voltage Vdd to the level defined by:

$$Vdd \cdot Cb(Cb + Cs2).$$

When a column address signal is input and column select line CS0 is selected, the potential of this column select line increases as shown in FIG. 2F. This renders activation MOSFET Q18 conductive so as to activate the sense amplifier of main bit line pair B0 and B0, namely, main sense amplifier MSA0. A minute potential difference, which occurs between main bit line pair B0 and B0 in accordance with the data stored in memory cell M1, is supplied through readout gate transistors Q14 and Q15 to main sense amplifier MSA0 and is amplified there. This amplified potential difference is transferred to inputoutput read lines IOR and I/OR through opened output gate transistors Q16 and Q17. The potential changes of inputoutput read lines IOR and IOR at this stage are illustrated in FIGS. 2G and 2H, respectively.

Then, to electrically disconnect sub-bit line pair DB01 ans DB01 to which the selected memory cell belongs, from the corresponding main bit line pair B0, and the B0, potential of sub-bit pair selection line BS0 is set to logic L and the potential of sense amplifier activation control line BSO to logic H. This renders gate transistors Q1 and Q2 as well as nonconductive transistor Q5 conductive. The potential changes on sub-bit line pair DB01 and DB01 at this stage, which have the selected memory cell M1, are respectively illustrated in FIGS. 2K and 2L. The other sub-bit line pairs DB02 and DB02. . . , are kept at the same state, i.e., are kept connected to the corresponding main bit line pairs and their sub-sense amplifiers are deactivated. Consequently, only sub-bit line pair DB01 and DB01 are subjected to a restoring operation by sub-sense amplifier SA01 in the main bit line pair B0 and Bo.

According to the circuit arrangement of this embodiment, in the restoring mode, not only the sub-bit line pair DB01 and DB01 to which the selected memory cell belongs, but also other sub-bit line pairs (e.g., DBn1 and DBn1), which are connected together to the same control lines BS0 and BS0 as sub-bit line pair DB01 and DB0l, are disconnected from the corresponding main bit line pairs, thus activating their sub-sense amplifiers (e.g., SAn1).

When data restoring on the aforementioned set of sub-bit line pair DB0l and DB1 is completed, the potentials on control lines BS0 and BS0 return to the initial states. Accordingly, these sub-bit line pairs DB01 and DB01, . . . , DBn1 and DBn1 are electrically connected to the corresponding main bit line pairs, thus deactivating their sub-sense amplifiers SA01, . . . , SAn1.

In the subsequent step, pre-charge clock signal :p is supplied through pre-charge control line PS to render pre-charge transistors including MOSFETs Q1l, Q12 and Q13 conductive, thus simultaneously charging all the main bit line pairs B0 and B0, . . . , Bn and Bn to source voltage Vcc. This sets the dRAM again to the pre-charge mode.

The divided-bit line type dRAM according to this invention provides the following technical advantages.

The first advantage is that the power consumption of the dRAM can be reduced. According to this divided-bit line type dRAM, one of sense amplifiers SA01, SA02, . . . is designated in the data raedout mode. The sense amplifiers which are respectively conected to the main bit line pairs are of the differential amplification type, generally known as "differential amplifiers". Such a differential amplifier does not cause the discharging of the main bit line pair, unlike an amplifier of the dynamic type. On the other hand, in the data restoring mode of the dRAM, only the sub-sense amplifiers along the selected word line are activated. Therefore, the current consumption can be minimized. For instance, with a divided-bit line type 1 mega-bit dRAM, the current consumed due to the discharging in a single memory accessing cycle is significantly reduced to about 3 mA.

The second advantage is that the data readout operation of the dRAM can be increased. Main sense amplifiers MSA0,. . . , MSAn provided on the main bit line pairs B are constituted by current mirror type differential amplifiers with the BICMOS structure, which differ from the conventional flip-flop type amplifiers using MOSFETs. MOSFETs Q14 and Q15 constituting the source follower circuit are connected to bipolar transistors T1 and T2 that have reduced input impedances for higher current amplification. These technical features significantly contribute to improving the sensitivity and speed of the sensing operation in the data readout mode.

The third advantages lies in that the integration density of the divided-bit line type dRAM can be improved. This is due to the use of main sense amplifiers MSA having the BICMOS structure for current amplification, the sensitivity of the sensing operation in the data readout mode can be increased while the sensitivity of the sense amplifiers, unlike in the conventional dRAM, does not significantly depend at all on the ratio of the capacitance of the main bit line pairs to the memory cell capacitance. The data potential of the selected memory cell M1 and the potential of the corresponding dummy cell appear on main bit line pair B0 and B0 so as to maintain a minute potential difference and are amplified by the current mirror type high-sensitive differential amplifier MSA0 with the BICMOS structure. Since bipolar transistors T1 and T2 perform current amplification, unlike in the conventional case, the sensitivity of the sense amplifier does not depend on the ratio of the capacitance of the main bit line pair to the memory cell capacitance. Therefore, the memory cell capacitance Cs can be set desirably small (below 20 femtofarad, for example) without impairing the operation margin of the main sense amplifier MSA. Consequently, the memory cells can be made smaller, thus significantly improving the integration density of the dRAM.

The fourth advantage lies in that the divided-bit line type dRAM having the aforementioned features (i.e., low power consumption, a high operation speed and high integration density) can be fabricated with a high yield without using a special manufacturing technique. At present, since the memory cell capacitance Cs cannot be set to a desired level (below 20 femtofarad, for example), semiconductor manufacturers have been making great efforts to develop new cell structures and the manufacturing techniques for maximizing the cell capacitance while reducing the cell area in order to provide a higher integration density. with the use of the above-described circuit structure of this invention, however, the memory cell capacitance Cs can be set lower than 20 femtofarad. Accordingly, dRAMs with a higher integration density can be manufactured without involving a special manufacturing technique. The use of the existing manufacturing technique to produce dRAMs with high integration density contributes to increasing the reliability of the memory cells and reducing the manufacturing cost, thereby minimizing the risk the semiconductor manufacturers have to take.

Although the invention has been described with reference to a specific embodiment, it shall be understood by those skilled in the art that numerous modifications may be made which are within the spirit and scope of the inventive contribution.

For instance, according to the aforementioned embodiment, a pair of inputoutput read lines IOR and IOR provided for memory cell data readout and a pair of inputoutput write lines IOW and IOW are provided separately for data storing. However, the circuit arrangement of the dRAM may be modified such that one pair of inputoutput lines can serve as these two pairs of lines. FIG. 3 shows the circuit arrangement of the main amplifier MSA desirable for this modification.

FIG. 3 illustrates the main sense amplifier MSA0 for main bit line pair B0 and B0; the same reference numerals as used in FIG. 1 are also used in FIG. 3 to represent corresponding elements so that their detailed description can be omitted. As illustrated in FIG. 3, p channel type MOSFETs Q50 and Q52 with the gate electrodes grounded are connected in parallel to npn conductivity type bipolar transistors T10 and T12, respectively. Bipolar transistors T10 and T12 have their base electrodes connected to the collector electrodes, respectively and are grounded. The parallel circuit of MOSFET Q50 and bipolar transistor T10 is connected to the collector electrode of bipolar transistor T1 that performs current amplification. The parallel circuit of MOSFET Q52 and bipolar transistor T12 is connected to the collector electrode of bipolar transistor T12.

MOSFETs Q16, Q17 and Q18 that serve as output gate transistors are connected together at the gate electrodes to data read column selection line CSr0. MOSFET Q19 and Q20 are connected together at the gate electrodes to data write column selection line CSw0. The structure involving two inputoutput line pairs can be simplified to the one having a single inputoutput line pair by dividing the column selection line CS0 into a data read column selection line CSr0 and a data write column selection line CSw0.

Further, the sub-sense amplifier SAi provided on each sub-bit line pair DBi and DBi may be designed to constitute a CMOS flip-flop circuit by providing p channel type MOSFETs in addition to the n channel type MOSFETs. Furthermore, the present invention can also apply to a divided-bit line type dRAM, which is designed to be operable without the dummy cells and charge the main bit line pair Bi and Bi to Vcc2.

What is claimed is:

1. A divided-bit line type dynamic random access memory comprising:
   (a) parallel main bit line pairs formed on a substrate, said main bit line pairs including a certain main bit line pair;
   (b) aub-bit line pairs provided in said certain main bit line pair;
   (c) transfer gate means connected between each of said sub-bit line pairs and said certain main bit line pair, for performing a switching operation in such a manner as to selectively control the electrical connection between said sub-bit line pairs and said certain main bit line pair;
   (d) parallel word lines provided on said substrate to insulatively cross with said sub-bit pairs;
   (e) memory cells provided at crossing points of said sub-bit line pairs and said word lines, each of said memory cells having a capacitive element for storing information and a switching transistor;

(f) first sense amplifier means connected to said main bit line pairs, for sensing and amplifying a potential difference on said certain main bit line pair connected to said specific sub-bit line pair, said first sense amplifier means comprising differential amplifier circuits; and (g) second sense amplifier means connected to said sub-bit line pairs, for sensing, in a data restoring mode, information stored in a selected memory cell which appears as a potential difference on a specific sub-bit line pair to which said selected memory cell is connected and which is disconnected from said certain main bit line pair, said second sense amplifier means comprising flip-flop amplifier circuits formed using unipolar transistors.

2. The device according to claim 1, wherein said second sense amplifier circuits comprise a current mirror type differential amplifier having a BIMOS structure constituted by unipolar transistors and bipolar transistors.

3. The memory according to claim 1, wherein said transfer gate means electrically connects said sub-bit line pairs to said certain main bit line pair in a precharge mode and the data readout mode, and, in a restoring mode, electrically disconnects said specific sub-bit line pair from said certain main bit line pair and activates a second sense amplifier circuit connected to said specific sub-bit line pair, thereby performing a restoring operation on said specific sub-bit line pair, with those second sense amplifier circuits which are connected to remaining sub-bit line pairs provided on said certain main bit line pair other than said specific sub-bit line pair being rendered inoperative.

4. The memory according to claim 1, wherein said differential amplifier circuits comprise current-mirror type differential amplifiers in each of which said unipolar transistors constitute a source follower circuit connected between said certain main bit line pair and said bipolar transistors.

5. The memory according to claim 4, wherein said unipolar transistors include metal oxide semiconductor field effect transistors.

6. The memory according to claim 1, further comprising:

(h) parallel dummy word lines formed on said substrate to insulatively cross said main bit line pairs; and (i) dummy cells provided at crossing points of said main bit line pairs and said dummy word lines, each of said dummy cells having a capacitive element for storing information and a voltage-controlled transistor.

7. The device according to claim 6, wherein said capacitive element of each of said dummy cells has a capacitance substantially half of that of said capacitive element of each of said memory cells.

* * * * *